United States Patent
Lee et al.

(10) Patent No.: US 8,053,767 B2
(45) Date of Patent: Nov. 8, 2011

(54) CARBON NANO TUBE THIN FILM TRANSISTOR AND DISPLAY ADOPTING THE SAME

(75) Inventors: Cheoljin Lee, Seoul (KR); Sangmin Park, Seoul (KR); Sunkug Kim, Seoul (KR)

(73) Assignee: Korea University Industrial & Academic Collaboration Foundation, Seongbuk-Gu, Seoul (KR)

( * ) Notice: Subject to any disclaimer, the term of this patent is extended or adjusted under 35 U.S.C. 154(b) by 179 days.

(21) Appl. No.: 12/371,966

(22) Filed: Feb. 17, 2009

(65) Prior Publication Data

US 2010/0133516 A1    Jun. 3, 2010

(30) Foreign Application Priority Data

Nov. 28, 2008 (KR) .................. 10-2008-0119950

(51) Int. Cl.
*H01L 29/08* (2006.01)
*H01L 35/24* (2006.01)
(52) U.S. Cl. .................. 257/40; 977/742
(58) Field of Classification Search .................. 257/40, 257/E51.026, E51.027, E51.039, E51.038, 257/E51.04; 977/742, 750, 752
See application file for complete search history.

(56) References Cited

U.S. PATENT DOCUMENTS

| 7,781,761 B2 * | 8/2010 | Meng | 257/40 |
| 2010/0224862 A1 * | 9/2010 | Endoh et al. | 257/24 |

FOREIGN PATENT DOCUMENTS

| KR | 1020070012629 A | 1/2007 |
| KR | 1020080083882 A | 9/2008 |

OTHER PUBLICATIONS

Office Action dated Jul. 12, 2010 in corresponding Korean Patent Application No. 10-2008-0119950.

* cited by examiner

*Primary Examiner* — Hung Vu
(74) *Attorney, Agent, or Firm* — Buchanan Ingersoll & Rooney PC

(57) ABSTRACT

Provided are a flexible and transparent carbon nano tube (CNT) thin film transistor using a degradable polymer substrate, and a display adapting the CNT thin film transistor. The polymer substrate is formed of a polymer material that is naturally degraded, and a CNT channel, where a semiconductive CNT is dispersed on a transparent organic material, is prepared on the polymer substrate. Source and drain electrodes, where a conductive CNT is ejected on a transparent organic material, are connected to both sides of the CNT channel. A gate, where a conductive CNT is dispersed on a transparent organic material, is disposed on or below the CNT channel, and a gate insulation layer including a transparent organic material is disposed between the CNT channel and the gate.

20 Claims, 1 Drawing Sheet

CARBON NANO TUBE THIN FILM TRANSISTOR AND DISPLAY ADOPTING THE SAME

CROSS-REFERENCE TO RELATED PATENT APPLICATION

This application claims the benefit of Korean Patent Application No. 10-2008-0119950, filed on Nov. 28, 2008, in the Korean Intellectual Property Office, the disclosure of which is incorporated herein in its entirety by reference.

BACKGROUND

1. Field of the Invention

The example embodiments relate to a thin film transistor (TFT) using a conductive carbon nano tube (CNT) and a semiconductive CNT, and more particularly, to a flexible and transparent TFT.

2. Description of the Related Art

A thin film transistor (TFT) is an important semiconductor device that is essential in a display field, and studies are being performed on such a TFT as a core device in a flexible electronics field that has recently come into the spotlight.

Currently, a carbon nano tube (CNT) has an excellent charge transmission characteristic and a large aspect ratio, and thus has both high charge mobility and transparency by obtaining a plurality of charge transmission paths. Moreover, the CNT has excellent elasticity, and thus is electrically and mechanically stable to the bending. Accordingly, the CNT is noticed as an element of the TFT.

A flexible electronics field includes a paper display, a foldable display, etc. Since a display must be freely folded or rolled up, all devices used in the display must be flexible. An important and main device of such flexible devices is a TFT that is mainly prepared by using an organic material. An organic TFT has a low production cost and is flexible, but has remarkably low charge mobility and switching speed compared to a polycrystal silicon TFT, and thus is difficult to be applied to a device that requires high charge mobility and high switching speed. Also, since the organic TFT partially includes an opaque element, studies on maintaining a flexible and stable electric characteristic while having a transparent structure are required to be performed, so as to be applied to the paper display, or the like.

Meanwhile, the paper display and the foldable display use a flexible substrate that is formed of plastic. However, since the plastic is semi-permanent that is difficult to be naturally degraded, using the plastic in the flexible substrate may cause an environmental pollution.

SUMMARY

Example embodiments provide a flexible and transparent carbon nano tube (CNT) having high electrically/electronically reliability, and a display adopting the same.

Example embodiments also provide CNT thin film transistor (TFT), which is formed of an environmental material and thus is naturally degraded when disposed of, and a display adopting the same.

According to an example embodiment, there is provided a thin film transistor including: a channel layer, which includes a transparent organic material and a semiconductive carbon nano tube (CNT) forming a mutually connected electric path in the organic material; source and drain electrodes, which includes a transparent organic material and a conductive CNT forming a mutually connected electric path in the organic material, wherein the source and drain electrode is electrically connected to both sides of the channel layer; a gate layer, which includes a transparent insulating or conductive organic material and a conductive CNT forming a mutually connected electric path in the organic material, wherein the gate layer corresponds to the channel layer; a gate insulation layer, which is disposed between the channel layer and the gate layer and includes an insulating material; and a degradable polymer substrate, which supports the channel layer, the source and drain electrodes, the gate layer, and the gate insulation layer.

The degradable polymer substrate may include at least one material from among starch, ester, cellulose, poly-hydroxyalkanoate (PHA), poly-hydrolybutyrate (PHB), poly butylene adipate telephtalate (PBAT), poly lactic acid (PLA), poly butylene succinate (PBS), polycaprolactone (PCL), polyvinyl alcohol (PVA), and polyglyclic acid (PGA). The degradable polymer substrate may be opaque, translucent, or transparent.

The semiconductive CNT of the channel layer may be a single-walled carbon nano tube (SWCNT). Also, at least one of the conductive CNTs of the source and drain electrodes and the gate layer may include at least one of SWCNT, a double-walled carbon nano tube (DWCNT), and a multi-walled carbon nano tube (MWCNT). Also, at least one of the organic materials of the source and drain electrodes and the gate layer may be any one of a transparent insulating organic material and a transparent conductive organic material.

The transparent insulating organic material may include at least one of polyimide (PI), parylene, polymethly methacrylate (PMMA), polyvinylalcohol (PVA), and polyvinylphenol (PVP), and the transparent conductive organic material may include at least one of poly(3,4-ethylenedioxythiophene) (PEDOT), polyaniline (PANI), and polypyrrole.

The channel layer may contain at least one of iodine (I), oxygen (O), and bromine (Br), or at least one of kalium (K), cesium (Cs), and nitrogen (N).

The channel layer may include any one of a p-type organic material and an n-type organic material, wherein the p-type organic material may be at least one selected from among pentacene, poly-thiophene, poly(3-alkylThiophene) (P3AT), polyacetylene, poly(thienylene-vinylene) (PTV), poly(3-hexylthiophene) (P3HT), and BPT2, and the n-type organic material may be at least one selected from among tetracyanoquinodimethane (TCNQ) and $C_{60}$ (fullerene).

The organic material contained in the channel layer may be a p-type organic material, and the channel layer may further contain at least one of I, O, and Br. Alternatively, the organic material contained in the channel layer may be an n-type organic material, and the channel layer may further contain at least one of K, Cs, and N.

The channel layer may include: a first layer including the organic material and the conductive CNT; and a second layer including any one impurity from among a p-type impurity and an n-type impurity.

The semiconductive CNT of the channel layer may include SWCNT, and the organic material of the channel layer may include an insulating organic material.

The organic material of the channel layer may include any one of a p-type organic material and an n-type organic material, wherein the p-type organic material is at least one selected from among pentacene, poly-thiophene, poly(3-alkylThiophene) (P3AT), polyacetylene, poly(thienylene-vinylene) (PTV), poly(3-hexylthiophene) (P3HT), and BPT2, and the n-type organic material includes at least one selected from among tetracyanoquinodimethane (TCNQ) and $C_{60}$ (fullerene).

The organic material of the channel layer may include any one organic insulation material selected from among PI, parylene, PMMA, PVA, and PVP.

The gate layer may be prepared below the channel layer. Alternatively, the gate layer may be prepared on the channel layer.

According to an example embodiment, there is also provided a display adopting the thin film transistor of above.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
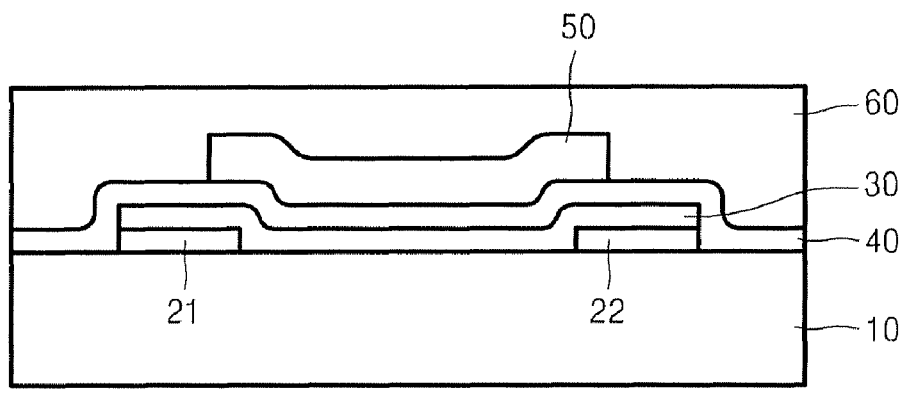
FIG. 1 is a cross-sectional view schematically illustrating a transparent and flexible carbon nano tube (CNT) thin film transistor (TFT), according to an example embodiment.

The example embodiments are described more fully hereinafter with reference to the accompanying drawings. This should not be construed as limiting the claims to the exemplary embodiments shown. Rather, these embodiments are provided to convey the scope of the invention to those skilled in the art. In the drawings, the size and relative sizes of elements and regions may be exaggerated for clarity.

It will be understood that when an element or layer is referred to as being "on", "disposed on", "disposed", or "between" another element or layer, it can be directly on, disposed on, disposed, or between the other element or layer, or intervening elements or layers can be present.

The terms "first," "second," and the like, "primary," "secondary," and the like, as used herein do not denote any order, quantity, or importance, but rather are used to distinguish one element, region, component, layer, or section from another. The terms "front", "back", "bottom", and/or "top" are used herein, unless otherwise noted, merely for convenience of description, and are not limited to any one position or spatial orientation.

The terms "a" and "an" do not denote a limitation of quantity, but rather denote the presence of at least one of the referenced item. The suffix "(s)" as used herein is intended to include both the singular and the plural of the term that it modifies, thereby comprising one or more of that term (e.g., the layer(s) includes one or more layers).

Reference throughout the specification to "one embodiment", "another embodiment", "an embodiment", and so forth, means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various exemplary embodiments.

Unless defined otherwise, technical and scientific terms used herein have the same meaning as is commonly understood by one of skill in the art to which this example embodiment belongs.

FIG. 1 is a cross-sectional view schematically illustrating a top gate type thin film transistor, according to an example embodiment.

A source electrode 21 and a drain electrode 22 are formed on a degradable polymer substrate 10, and a polymer channel layer 30, which has transparent flexibility and has both ends covering the source electrode 21 and the drain electrode 22. Also, a gate insulating layer 40, which has transparent flexibility and may be formed of polymer, is formed on the polymer channel layer 30, and a gate layer 50, which has transparent flexibility and may be formed of polymer, is formed on the gate insulating layer 40. A passivation layer 60, which protects the substrate 10, the source electrode 21, the drain electrode 22, the polymer channel layer 30, the gate insulating layer 40, and the gate layer 50, is formed on the top.

The degradable polymer substrate 10 may be formed of a bio-degradable, bio-disintegrable, or optical degradable material. In detail, the degradable polymer substrate 10 may be formed of, or include at least one of starch, ester, cellulose, poly-hydroxyalkanoate (PHA), poly-hydrolybutyrate (PHB), poly butylene adipate telephtalate (PBAT), poly lactic acid (PLA), poly butylene succinate (PBS), polycaprolactone (PCL), polyvinyl alcohol (PVA), and polyglyclic acid (PGA), and may selectively have a mechanical characteristic of being flexible or hard, and an optical characteristic of opaque, translucent, or transparent. Alternatively, the degradable polymer substrate 10 may be formed of a mixed material of a natural substance such as starch, and a polymer such as polyethylene (PE) or polypropylene (PP) that is chemically synthesized.

The source electrode 21, the drain electrode 22, and the gate layer 50 are formed of a material where a conductive carbon nano tube (CNT) is dispersed in a conductive or insulating polymer, such as poly(3,4-ethylenedioxythiophene) (PEDOT), polyaniline (PANI), polypyrrole, polyimide (PI), parylene, polymethly methacrylate (PMMA), polyvinylalcohol (PVA), or polyvinylphenol (PVP). The insulating polymer is a transparent insulating material which operates a binder for binding the conductive CNT, whereas the conductive polymer not only operates as a binder but also provides a conductive path. The conductive CNT may be a double-walled carbon nano tube (DWCNT) or multi-walled carbon nano tube (MWCNT).

The gate insulating layer 40 and the passivation layer 60 may be formed of an insulting organic material such as PI, parylene, PMMA, PVA, or PVP.

Meanwhile, the polymer channel layer 30 is formed of an organic polymer material wherein SWCNT is dispersed. The organic polymer material may be an insulating or organic semiconductor material. A binder used in the source electrode 21 and the drain electrode 22 may be used as the insulating material. Also, following materials may be used as the organic semiconductor material.

p-type: pentacene, poly-thiophene, poly(3-alkylthiophene) (P3AT), polyacetylene, poly(thienylene-vinylene) (PTV), poly(3-hexylthiophene) (P3HT), or BPT2 n-type: tetracyanoquinodimethane (TCNQ), $C_{60}$ (Fullerene)

Meanwhile, the polymer channel layer 30 may include at least one of iodine (I), oxygen (O), and bromine (Br) as a p-type impurity, or at least one of kalium (K), cesium (Cs), and nitrogen (N) as an n-type impurity.

Such an impurity of the polymer channel layer 30 amplifies a current of the polymer channel layer 30, since the impurity operates as an acceptor or a doner, which takes away electrons from the SWCNT or provides electrons to the SWCNT, when contacts the SWCNT.

The thin film transistor having such a structure may be prepared via a general process. For example, the thin film transistor may be prepared by using a film forming/patterning process including dielectrophoresis, spray, electrospray, spincoating, nanoimprint, and spincasting.

A process of preparing the thin film transistor will now be described.

First, the degradable polymer substrate 10 formed of a degradable material is prepared. As described above, the degradable polymer substrate 10 may be formed of at least one material from among starch, ester, cellulose, PHA, PHB, PBAT, PLA, PBS, PCL, PVA, PGA, and PCL. The degradable polymer substrate 10 may be opaque, translucent, or transparent. Alternatively, the degradable polymer substrate 10 may be transparent.

To form a stable organic layer and to improve characteristics of the thin film transistor, an oxygen plasma process ($O_2$ plasma) or a self assembly monolayer (SAM) process using octadecyltrichlorosilane (OTS) or 3-aminopropyltriethoxysilane (APS) may be selectively performed on the prepared degradable polymer substrate 10.

The source electrode 21 and the drain electrode 22 may be formed via shadow mask, electron beam lithography, or photo lithography. Here, the source electrode 21 and the drain electrode 22 is formed of a mixed material of the conductive CNT, such as DWCNT or MWCNT, and the conductive polymer material or insulating polymer material described above. When DWCNT or MWCNT is mixed with the insulating polymer material, DWCNT or MWCNT is mutually necked, and thus a conductive path need to be allowed in a polymer material While preparing SWCNT, a catalyst is prepared via a modified sol-gel method in order to adjust a diameter and chirallity by adjusting the size of the catalyst, and then small and uniform nano particles having a size equal to or below several nm are formed in a nano pore of a supporter via a calcination process. Then, the SWCNT is synthesized to the catalyst by adjusting a type and a flux of a reaction gas ($C_2H_4$, $C_2H_2$, $CH_4$), and a reaction temperature. A semiconductive polymer material of the synthesized SWCNT is mixed with an insulating material, and then SWCNT is used to in a channel forming. When SWCNT is mixed with the insulating material, the SWCNT is mutually necked, and thus a semiconductive electric path needs to be allowed.

The gate insulating layer 40 may use an insulating organic material, such as PI, parylene, PMMA, PVA, or PVP that is used to form the source electrode 21, the drain electrode 22, and the polymer channel layer 30.

The top gate type thin film transistor is described above with reference to FIG. 1. According to another embodiment, a bottom type thin film transistor is provided as illustrated in FIG. 2.

Figure 2:
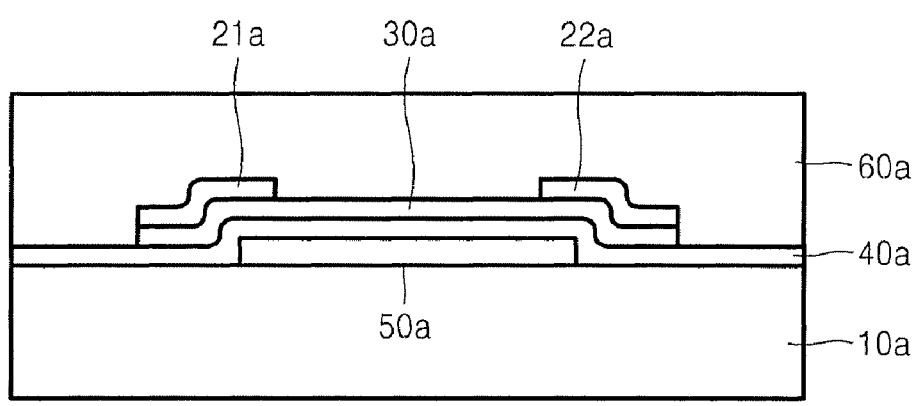
FIG. 2 is a cross-sectional view schematically illustrating a transparent and flexible CNT TFT, according to another example embodiment.

Referring to FIG. 2, a gate layer 50a is formed on a transparent flexible substrate 10a. A gate insulating layer 40a is entirely formed on the gate layer 50a. A channel layer 30a corresponding to the gate layer 50a is formed on the gate insulating layer 40a, and a source electrode 21a and a drain electrode 22a are formed on each side of the channel layer 30a. Also, a passivation layer 60a is formed on the top to protect the transparent flexible substrate 10a, the gate layer 50a, the gate insulating layer 40a, the channel layer 30a, the source electrode 21a, and the drain electrode 22a. Materials of each element of the bottom gate type thin film transistor are identical to those of the top gate type thin film transistor of FIG. 1.

Meanwhile in the above embodiments, the channel layers 30 and 30a may include at least one of I, O, and Br as a p-type impurity, and may include at least one of K, Cs, and N as an n-type impurity. The p-type and n-type impurities may be mixed in the channel layers 30 and 30a, like SWCNT, or may be separately stacked. In other words, in a thin film transistor according to an embodiment, a channel layer may have a single-layered or a multi-layered structure. The channel layer of the multi-layered structure may include a first layer including SWCNT and a second layer including the p-type or n-type impurity. The first layer includes an organic semiconductor material, or a SWCNT with a binder formed of an organic insulating material. As described above, the second layer includes at least one of I, O, and Br as the p-type impurity or at least one of K, Cs, and N as the n-type impurity, with a binder formed of an insulating organic material.

Figure 3:
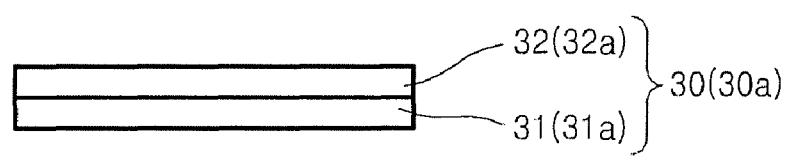
FIG. 3 is a diagram illustrating a channel layer applied to a transparent and flexible CNT TFT, according to an example embodiment.

As illustrated in FIG. 3, first layers 31 and 31a and second layers 32 and 32a of the channel layers 30 and 30a mutually contact each other, and thus SWCNT of the first layers 31 and 31a may include at least one of I, O, and Br as a p-type impurity and at least one of K, Cs, and N as an n-type impurity of the second layers 32 and 32a. In FIG. 3, the first layers 31 and 31a is disposed below the second layers 32 and 32a, but according to another embodiment, the second layers 32 and 32a may be disposed below the first layers 32 and 32a.

An impurity of such channel layers 30 and 30a amplifies a current of the channel layers 30 and 30a, since the impurity operates as an acceptor or a doner, which takes away electrons from the SWCNT or provides electrons to the SWCNT, when contacts the SWCNT.

A thin film transistor according to an embodiment uses a substrate formed of a degradable material. Accordingly, when the thin film transistor is disposed of, the substrate naturally degrades, and thus environmental pollution is decreased. Also, both of a conductive material and a semiconductor material of the thin film transistor include CNT, and the thin film transistor is transparent and flexible. Accordingly, when the thin film transistor is applied in a display, an aperture ratio of pixels remarkably increases. Also, since the conductive material and the semiconductor material both use CNT, a thin film transistor and a display having excellent electric/electronic reliability are obtained.

The thin film transistor according to the example embodiments may be adopted in a display having a general structure, specifically in an organic light emitting diode (OLED) display. It is convenient to adopt the thin film transistor in the OLED display, but a display according to an embodiment has a structure where the thin film transistor is formed on a degradable substrate as described above.

While the example embodiments have been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin film transistor comprising:
    a channel layer, which comprises an organic material and a semiconductive carbon nano tube (CNT) forming a mutually connected electric path in the organic material;
    source and drain electrodes, which comprises an organic material and a conductive CNT forming a mutually connected electric path in the organic material, wherein the source and drain electrode is electrically connected to both sides of the channel layer;
    a gate layer, which comprises an organic material and a conductive CNT forming a mutually connected electric path in the organic material, wherein the gate layer corresponds to the channel layer;

a gate insulation layer, which is disposed between the channel layer and the gate layer and comprises an insulating material; and a degradable polymer substrate, which supports the channel layer, the source and drain electrodes, the gate layer, and the gate insulation layer.

2. The thin film transistor of claim 1, wherein the degradable polymer substrate comprises at least one material from among starch, ester, cellulose, poly-hydroxyalkanoate (PHA), poly-hydrolybutyrate (PHB), poly butylene adipate telephtalate (PBAT), poly lactic acid (PLA), poly butylene succinate (PBS), polycaprolactone (PCL), polyvinyl alcohol (PVA), and polyglyclic acid (PGA).

3. The thin film transistor of claim 1, wherein the semiconductive CNT of the channel layer is a single-walled carbon nano tube (SWCNT).

4. The thin film transistor of claim 1, wherein at least one of the conductive CNTs of the source and drain electrodes and the gate layer comprises at least one of SWCNT, a double-walled carbon nano tube (DWCNT), and a multi-walled carbon nano tube (MWCNT).

5. The thin film transistor of claim 1, wherein at least one of the organic materials of the source and drain electrodes and the gate layer is any one of a transparent insulating organic material and a transparent conductive organic material.

6. The thin film transistor of claim 5, wherein the transparent insulating organic material comprises at least one of polyimide (PI), parylene, polymethly methacrylate (PMMA), polyvinylalcohol (PVA), and polyvinylphenol (PVP), and the transparent conductive organic material comprises at least one of poly(3,4-ethylenedioxythiophene) (PEDOT), polyaniline (PANI), and polypyrrole.

7. The thin film transistor of claim 1, wherein the channel layer contains any one of iodine (I), oxygen (O), bromine (Br), kalium (K), cesium (Cs), and nitrogen (N).

8. The thin film transistor of claim 1, wherein the channel layer comprises any one of a p-type organic material and an n-type organic material, wherein the p-type organic material is at least one selected from among pentacene, poly-thiophene, poly(3-alkylThiophene) (P3AT), polyacetylene, poly(thienylene-vinylene) (PTV), poly(3-hexylthiophene) (P3HT), and BPT2, and the n-type organic material comprises at least one selected from among tetracyanoquinodimethane (TCNQ) and $C_{60}$ (fullerene).

9. The thin film transistor of claim 8, wherein the channel layer containing the p-type organic material contains at least one of I, O, and Br, and the channel layer containing the n-type organic material contains at least one of K, Cs, and N.

10. The thin film transistor of claim 1, wherein the channel layer comprises:

a first layer comprising the organic material and the conductive CNT; and a second layer comprising any one impurity from among a p-type impurity and an n-type impurity.

11. The thin film transistor of claim 10, wherein the semiconductive CNT of the channel layer comprises SWCNT, and the organic material of the channel layer comprises an insulating organic material.

12. The thin film transistor of claim 11, wherein at least one of the conductive CNTs of the source and drain electrodes and the gate layer comprises at least one of SWCNT, a DWCNT, and a MWCNT.

13. The thin film transistor of claim 10, wherein the organic material of the channel layer comprises any one of a p-type organic material and an n-type organic material, wherein the p-type organic material is at least one selected from among pentacene, poly-thiophene, poly(3-alkylThiophene) (P3AT), polyacetylene, poly(thienylene-vinylene) (PTV), poly(3-hexylthiophene) (P3HT), and BPT2, and the n-type organic material comprises at least one selected from among tetracyanoquinodimethane (TCNQ) and $C_{60}$ (fullerene).

14. The thin film transistor of claim 10, wherein the organic material of the channel layer comprises any one organic insulation material selected from among PI, parylene, PMMA, PVA, and PVP.

15. The thin film transistor of claim 10, wherein at least one of the conductive CNTs of the source and drain electrodes and the gate layer comprises at least one of SWCNT, a DWCNT, and a MWCNT.

16. A display adopting the thin film transistor of claim 1.

17. The display of claim 16, wherein the degradable polymer substrate comprises at least one material from among starch, ester, cellulose, PHA, PHB, PBAT, PLA, PBS, PCL, PVA, PGA, and PCL.

18. The display of claim 16, wherein the semiconductive CNT of the channel layer is SWCNT.

19. The display of claim 16, wherein at least one of the conductive CNTs of the source and drain electrodes and the gate layer comprises at least one of SWCNT, a DWCNT, and a MWCNT.

20. The display of claim 16, wherein at least one of the organic materials of the source and drain electrodes and the gate layer is a transparent organic material.

* * * * *